(12) United States Patent
Ahn et al.

(10) Patent No.: US 8,030,172 B1
(45) Date of Patent: Oct. 4, 2011

(54) ISOLATION TECHNOLOGY FOR SUBMICRON SEMICONDUCTOR DEVICES

(75) Inventors: Yongchul Ahn, Eagan, MN (US); Kaichiu Wong, Sunnyvale, CA (US); Venuka Jayatilaka, Savage, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 1852 days.

(21) Appl. No.: 10/436,411

(22) Filed: May 12, 2003

Related U.S. Application Data

(63) Continuation-in-part of application No. 09/659,291, filed on Sep. 12, 2000, now abandoned.

(51) Int. Cl.
*H01L 21/76* (2006.01)

(52) U.S. Cl. .................. 438/435; 257/E21.546

(58) Field of Classification Search .................. 438/435; 257/E21.546
See application file for complete search history.

(56) References Cited

U.S. PATENT DOCUMENTS

| | | | |
|---|---|---|---|
| 4,631,803 A | 12/1986 | Hunter et al. | |
| 4,789,648 A | 12/1988 | Chow et al. | |
| 4,851,662 A | 7/1989 | Ott et al. | |
| 4,870,470 A * | 9/1989 | Bass et al. | 257/324 |
| 4,954,142 A | 9/1990 | Carr et al. | |
| 5,262,354 A | 11/1993 | Cote et al. | |
| 5,447,884 A | 9/1995 | Fahey et al. | |
| 5,943,599 A * | 8/1999 | Yao et al. | 438/623 |
| 6,022,776 A * | 2/2000 | Lien et al. | 438/253 |
| 6,159,823 A | 12/2000 | Song et al. | |
| 6,165,854 A | 12/2000 | Wu | |
| 6,326,282 B1 | 12/2001 | Park et al. | |
| 6,333,242 B1 * | 12/2001 | Hwang et al. | 438/435 |
| 6,465,373 B1 * | 10/2002 | Zheng et al. | 438/794 |
| 6,596,654 B1 * | 7/2003 | Bayman et al. | 438/788 |
| 6,867,086 B1 * | 3/2005 | Chen et al. | 438/219 |
| 2002/0068416 A1 * | 6/2002 | Hsieh et al. | 438/435 |
| 2002/0076917 A1 * | 6/2002 | Barth et al. | 438/624 |

OTHER PUBLICATIONS

Omar et al., "The Effect of Backside Films on Rapid Thermal Oxidation (RTO) Growth on Silicon Wafers", ICSE'98 Proc., Nov. 1998, pp. 81-85.*
Encyclopedia of Chemical Technology, Kirk-Othmer, vol. 14, pp. 677-709 (1995).
Pearson, G.L., et al., "Deformation and Fracture of Small Silicon Crystals," *Acta Metallurgica*, vol. 5, 1957, pp. 181-191.
Runyan, W.R., "Elastic Constants," Silicon Semiconductor Technology, Texas Instruments Electronics Series, McGraw-Hill Book Company, 1965, pp. 216-218.
Microchip Fabrication: A Practical Guide to Semiconductor Processing, 3rd. edition, Peter Van Zant, McGraw-Hill, Chapter 16, pp. 491-527 (2000).
Visser, C.C.G., et al., "A New Silicon Nitride Mask Technology for Synchrotron Radiation X-Ray Lithography: First Results," *Micro Electronic Engineering* 6, 1987, pp. 299-303.
Pierret, Robert F., "Semiconductor Device Fundamentals", p. 4, Table 1.1, Addison-Wesley, 1996.

* cited by examiner

*Primary Examiner* — Lex Malsawma

(57) ABSTRACT

A semiconductor structure has a substrate having a trench, an isolation dielectric in the trench, and a stress buffer layer, between the substrate and the dielectric. Semiconductor devices containing the semiconductor structure may have higher reliability, and may have a reduced manufacturing costs per device.

20 Claims, 3 Drawing Sheets

ISOLATION TECHNOLOGY FOR SUBMICRON SEMICONDUCTOR DEVICES

CROSS REFERENCE TO RELATED APPLICATIONS

This application is a continuation-in-part of patent application Ser. No. 09/659,291 filed on Sep. 12, 2000 now abandoned "Isolation Technology For Submicron Semiconductor Devices."

BACKGROUND

The present invention relates to an isolation technology for semiconductor devices. A variety of methods and structures have been used to isolate areas on semiconductor devices. One conventional technology is based on localized oxidation of silicon (LOCOS), shown in FIG. 1. In FIG. 1, on the silicon substrate 102 is a field oxide 104 that acts to isolate an active area of the semiconductor device; the field oxide is contiguous with the gate oxide 110 on the active region of the silicon substrate. The active area in this illustration includes a layer of silicon nitride 106. The field oxide encroaches on the active area in the shape of a bird's beak 108, before narrowing into the gate oxide. This large encroachment distorts the active region, and interferes with the submicron lithography necessary to construct elements in the active region.

Another widely used isolation technique is silicon trench isolation (STI), shown in FIG. 2. The field oxide 104 does not have the shape of a bird's beak where it narrows into the gate oxide 110 on the silicon substrate 102. FIGS. 3(a)-3(e) illustrate the step used to prepare the structure shown in FIG. 2. In FIG. 3(a) thermal oxidizing forms a thermal oxide layer 111 on the silicon substrate 102, followed by depositing a silicon nitride layer 106 using low pressure chemical vapor deposition (LPCVD). In FIG. 3(b) a photoresist layer 112 is applied, and patterned using a mask. Etching of those portions of the silicon nitride, thermal oxide and silicon substrate not covered by the photoresist layer, in a single operation, opens a trench 114.

In FIG. 3(c) the photoresist layer is first stripped, and the substrate is cleaned. A thin oxide layer 118 is then grown by dry oxidation of the exposed portions of the silicon substrate. An oxide layer 116 is then deposited into the trench and across the surface of the structure by chemical vapor deposition (CVD). In FIG. 3(d) chemical-mechanical polishing (CMP) planarizes the surface, leaving the oxide layer 116 only in the trench. In FIG. 3(e) the silicon nitride and thermal oxide layers are removed, and a gate oxide layer 110 is grown on the silicon substrate.

After forming the field oxide, additional processing is used to produce semiconductor devices on the substrate. These subsequent processes include heating cycles, for example during CVD oxide desification or drive-in for preparing doped regions. Since there is mismatch between the thermal expansion of the substrate and the field oxide, stress is induced at the interface between them during heating. If the temperature is sufficiently high during heating such that the yield point of the substrate is reduced to a value comparable to the strain induced by the heating, then the substrate will relax at the high temperature and lock the strain in at room temperature. The locked in strain might cause dislocations and a strained surface of silicon at the interface, producing high leakage rates during operation of devices. For example, the expansion coefficient between silicon dioxide and silicon at 800° C. is about 0.26%, which is beyond the yield point of silicon at 800° C., and therefore plastic deformation of the silicon will take place at the interface; upon cooling to room temperature strain will be present at the interface.

U.S. Pat. No. 4,851,662 to Park et al. discloses a method of forming a isolation trench in which a nitride liner formed in a trench is protected during subsequent plasma processing. After forming the nitride liner, a high temperature oxide layer is formed on the nitride liner using a first process. Then, upon forming the high temperature oxide layer, plasma processing is performed on the surface of the high temperature oxide layer. After the plasma processing, a trench fill dielectric layer to fill the trench is formed on the high temperature oxide layer using a second process. Park et al. forms two types of layers using two process steps in addition to plasma processing in order to fill the trench upon depositing the nitride liner.

BRIEF SUMMARY

In a first aspect, the present invention is a semiconductor structure, having a substrate having a trench, an isolation dielectric in the trench, and a stress buffer layer, between the substrate and the dielectric.

In a second aspect, the present invention is a method of making a semiconductor structure, including forming an isolation dielectric on a structure. The structure has a substrate having a trench, and a stress buffer layer in the trench.

DEFINITIONS

A thick dielectric layer is a dielectric layer (for example, a silicon oxide layer or silicon nitride layer) that has a thickness greater than the thickness of a thin dielectric layer, and preferably has a thickness of 1000 to 50000 Å, more preferably a thickness of 5000 to 10000 Å.

A thin dielectric layer is a dielectric layer (for example, a silicon oxide layer or silicon nitride layer) that has a thickness less than the thickness of a thick dielectric layer, and preferably has a thickness of 10 to 999 Å, more preferably a thickness of 100 to 350 Å.

The term "exposed regions" means regions of a structure that are not covered by another structure.

The term "planarizing" means to remove material, preferentially in the vertical direction, enhancing the flatness of the structure being planarized.

The term "stress buffer layer" means a layer that has a thermal linear expansion that has a smaller absolute difference with the thermal linear expansion of the substrate than the isolation dielectric, in the temperature range of 100 to 800° C.

The term "adjacent" mean that there are no functional structures between the specified structures. A functional structure is a structure intentionally placed on the semiconductor device that affects the function of the device. For example, a functional structure may mean a structure having a predetermined set of dimensional and/or compositional parameter values, that has an electrical, mechanical and/or optical function (e.g., conductive, insulative, masking, photolithographic, antireflective).

The term "oxide" refers to a metal oxide conventionally used to isolate electrically active structures in an integrated circuit from each other, typically an oxide of silicon and/or aluminum (e.g., $SiO_2$ or $Al_2O_3$, which may be conventionally doped with fluorine, boron, phosphorous or a mixture thereof, preferably $SiO_2$ or $SiO_2$ conventionally doped with 1-12 wt % of phosphorous and 0-8 wt % of boron).

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein.

DETAILED DESCRIPTION

The present invention includes a stress buffer layer between the substrate and the isolation structure to compensate for the differences between the thermal expansion of the substrate and the isolation structure. Since the stress buffer layer has a thermal linear expansion that more closely matches the substrate than the isolation structure, less stress will be induced into the substrate. This will reduce the likelihood of high leakage rates when fabricated devices are in operation. The invention provides a semiconductor device that may have higher reliability, and that may reduce manufacturing costs per device.

Figure 1:
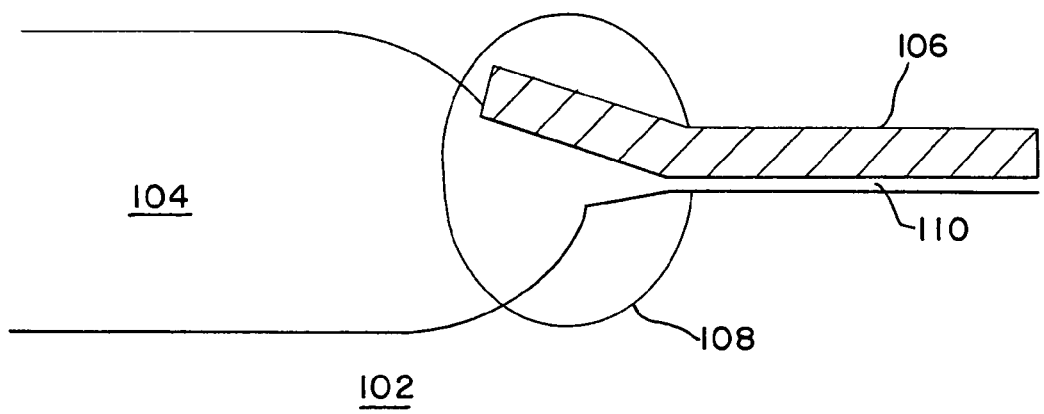
FIG. 1 shows an edge-on view of a portion of a semiconductor device containing field oxide formed by LOCOS.
Figure 2:
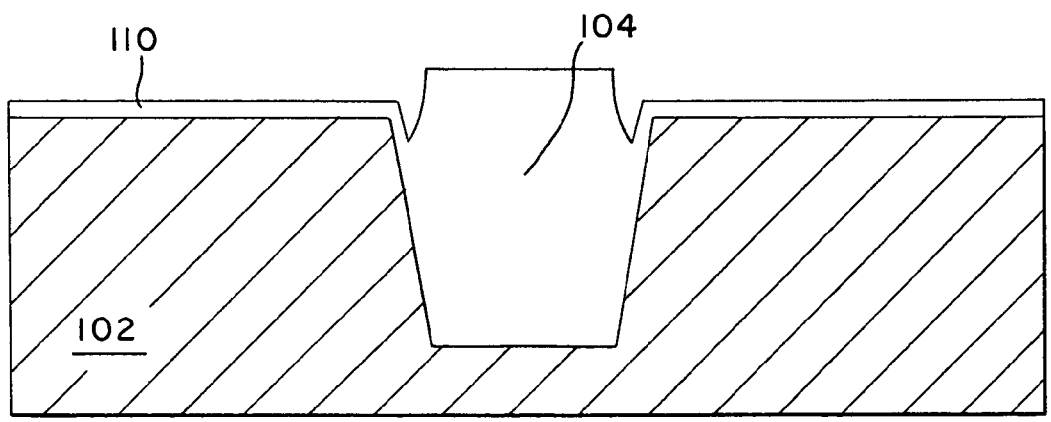
FIG. 2 shows an edge-on view of a portion of a semiconductor device containing field oxide formed by STI.
Figure 3A:
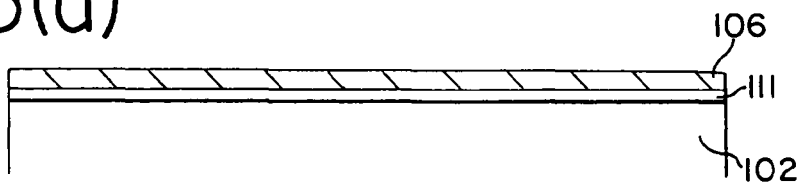
FIGS. 3(a)-3(e) illustrate a series of successive edge-on views for forming the structure of FIG. 2.
Figure 3B:
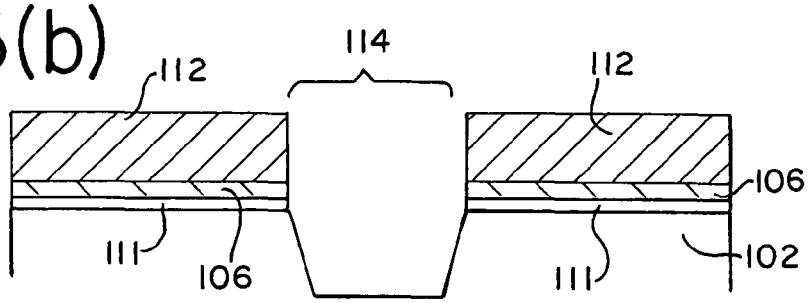
Figure 3C:
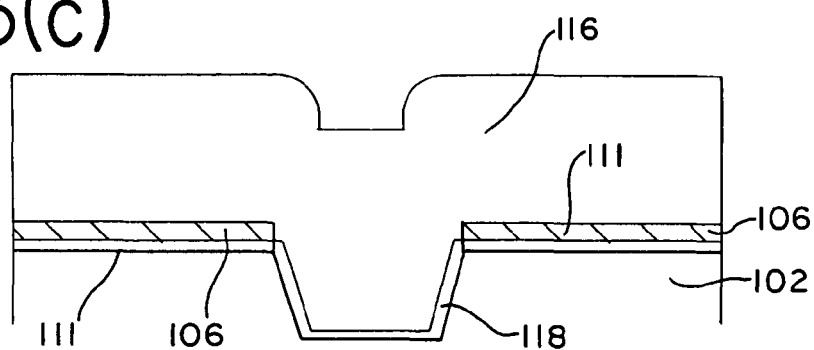
Figure 3D:
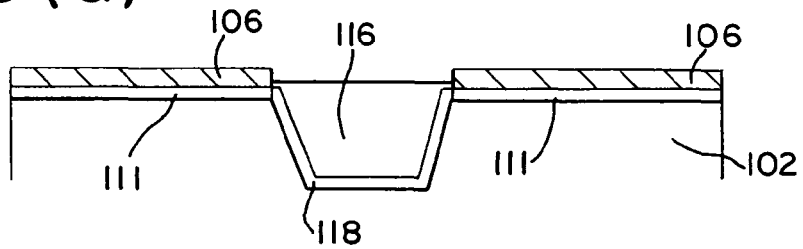
Figure 3E:
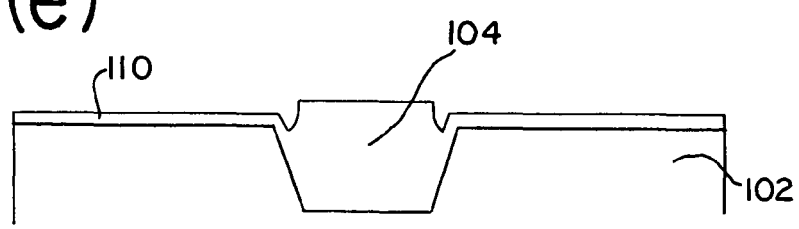
Figure 4A:
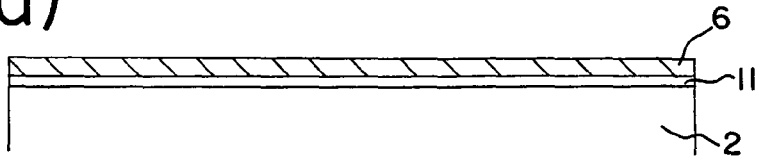
FIGS. 4(a)-4(f) illustrate a series of successive edge-on views for an embodiment of the present invention.
Figure 4B:
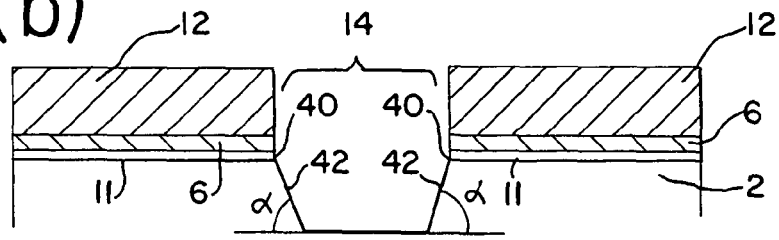

FIGS. 4(a)-4(f) illustrate an embodiment of the invention. In FIG. 4(a), an etch-stop layer 6 covers a thin dielectric layer 11, which in turn covers a semiconductor substrate 2. Preferably, the semiconductor substrate 2 is single crystal silicon, the dielectric layer 11 is a thermally grown oxide layer, and the etch-stop layer 6 is a low stress silicon nitride layer formed by LPCVD. In one embodiment, an alignment mark (not shown) having a depth of between 600 Å and 1000 Å, and preferably between 700 Å and 900 Å, is etched into the semiconductor substrate 2. Preferably, the thin dielectric layer 11 is between 100 Å and 200 Å in thickness, and more preferably, between 130 Å and 170 Å in thickness. Preferably, the thin dielectric layer 11 is grown in a furnace using $O_2$ gas at a temperature between 800° C. and 900° C. Preferably, etch-stop layer 6 is between 1300 Å and 2200 Å in thickness, and more preferably, between 1500 Å and 2000 Å in thickness.

A photoresist layer 12 is applied to the surface of the structure, and patterned. Etching of those portions of the etch-stop layer 6, the thin dielectric layer 11 and the substrate 2 not covered by the photoresist layer, in a single operation, opens a trench 14, illustrated in FIG. 4(b). Preferably, the trench has a depth of between 3500 Å and 5500 Å, and more preferably, a depth of between 4000 Å and 5000 Å. In one embodiment, upon forming the trench 14, n-type core implantation is performed at the corners 40 of the trench 14 in order to reduce the amount of leakage. Preferably, the sides 42 of the trench 14 are formed having a slope or angle α of 75° to 80° in order to avoid stress concentrations at the corners 40 of the trench 14.

Next, the photoresist is stripped and the structure cleaned, and then a thin dielectric liner layer 15 is formed over the bottom of the trench 14. If the thin dielectric liner layer 15 is silicon oxide, it may be formed by dry oxidation of a silicon containing substrate. An alternative to dry oxidation is conventional deposition of a silicon oxide layer. In one embodiment, the thin dielectric liner layer 15 is formed by thermal oxidation of a silicon containing substrate. In either case, the forming of the thin dielectric liner layer 15 may be followed by conventional annealing. Preferably, the thin dielectric liner layer 15 is formed having a thickness of between 200 Å and 400 Å by growing an oxide, and then, using thermal oxidation of $O_2$ at a temperature of between 800° C. and 900° C., grown to a thickness of between 900 Å and 1300 Å, and more preferably of between 1000 Å and 1200 Å.

Figure 4C:
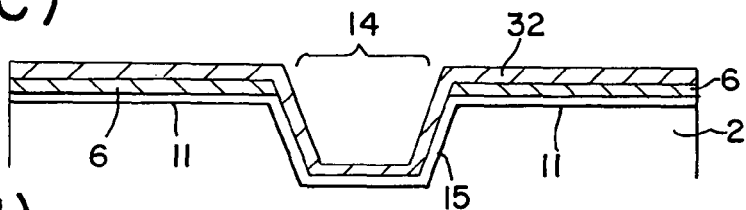

A stress buffer layer 32 is then formed on the structure, as shown in FIG. 4(c). In one embodiment, the stress buffer layer 32 is low stress silicon nitride deposited by LPCVD, followed by dry oxidation. Preferably, the low stress silicon nitride is formed using dichlorosilane ($SiH_2Cl_2$) and ammonia ($NH_3$) gases in LPCVD. Preferably, the low stress silicon nitride is formed using a process temperature of between 800° C. and 900° C., and more preferably, between 825° C. and 850° C. Preferably, the low stress silicon nitride is formed using a gas ratio of $SiH_2Cl_2:NH_3$ is of between 3:1 and 6:1, and more preferably, between 4:1 and 5:1 in order to make low stress silicon nitride with the index of refraction of between 2.0 and 2.5, and preferably, between 2.2 and 2.4. In one embodiment, the low stress silicon nitride has an index of refraction of 2.3±0.1. The stress buffer layer 32 will act to reduce stress between the substrate 2 and an isolation dielectric 16, as described below. In one embodiment, the stress buffer layer 32 is silicon rich nitride. In one embodiment, the stress buffer layer 32 has a thickness of between 100 Å and 250 Å. The stress buffer layer 32 compensates for the differences between the thermal expansion of the substrate 2 and the isolation dielectric 16, thereby avoiding plastic deformation of the substrate 2 due to subsequent high temperature processes that may cause crystalline defects to appear in the substrate 2.

Figure 4D:
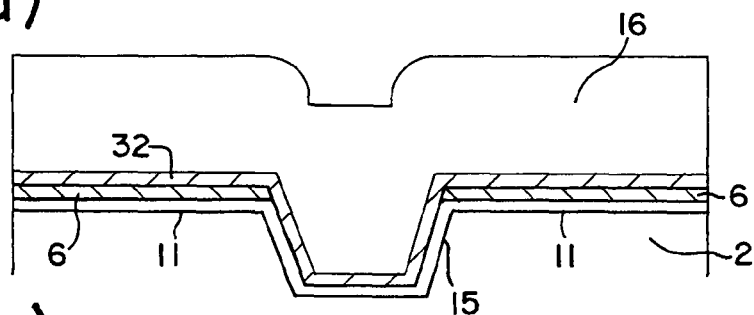

Next, a thick dielectric layer 16, such as an isolation dielectric 16, is formed in the trench 14 and across the surface of the structure, as shown in FIG. 4(d). Preferably, the trench 14 is filled with the isolation dielectric 16. For example, the isolation dielectric 16 may be an oxide formed by chemical vapor deposition (CVD). In one embodiment, no plasma processing of the trench 14 is performed after forming the trench 14 and before filling the trench 14 with the dielectric layer 16. As used herein, the term "plasma processing" excludes any deposition of or etching of significant amount of material. Significant amounts of material refers to when more than about 100 Å in thickness of material is deposited or etched. However, the term "plasma processing" does include any damage or etching of low stress silicon nitride.

Preferably, the thick dielectric layer 16 is formed using high density plasma (HDP) deposition to form between 4500 Å to 6500 Å of silicon dioxide. More preferably, the isolation dielectric 16 is formed from a plasma, such as a high density plasma (HDP), prepared from a mixture of $SiH_4$ and $N_2O$. The $SiH_4$ has at a flow rate of between 100 sccm and 200 sccm and the $N_2O$ has a flow rate of between 200 sccm and 400 sccm. In one embodiment, the isolation dielectric 16 is formed from a plasma, such as an HDP, prepared from a mixture of $SiH_4$ and $O_2$, wherein the $SiH_4$ has at a flow rate of between 100 sccm and 200 sccm and the $O_2$ has a flow rate of between 200 sccm and 400 sccm. The HDP deposition is performed using a low frequency (LF) power of between 4000 W and 4400 W and a high frequency (HF) power of between 1800 W and 2200 W resulting in an etch rate of between 17000 Å/min and 19000 Å/min and a deposition rate of between 12,000 Å/min and 13,000 Å/min. Preferably, the HDP deposition is performed at a pressure of between 13 mTorr and 18 mTorr, and more preferably between 14 and 16 mTorr. Preferably, the HDP deposition is performed at a temperature of between 400° C. to 500° C. Preferably, the thick dielectric layer 16 is formed by depositing between 500 Å and 1500 Å of silicon dioxide using HDP deposition, and then followed by a deposition/etch sequence of an additional 4000 Å to 5000 Å of silicon dioxide using HDP deposition for a dielectric layer 16 that is a total of 4500 Å to 6500 Å thick. Preferably, the thick dielectric layer 16 is deposited at a temperature of less than 550° C., and more preferably at a temperature of between 400° C. to 500° C. The HDP deposition along with the proper low pressure may be used to disassociate the gases used in the process, $SiH_4$ and $N_2O$, to make silicon dioxide. One advantage of using an HDP deposition is that the HDP deposition has a relatively high deposition rate and creates a fairly good and dense silicon dioxide using relatively low temperatures.

Figure 4E:
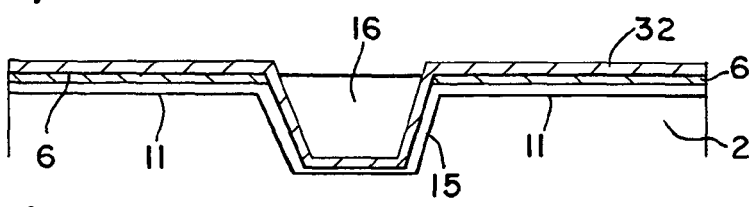
Figure 4F:
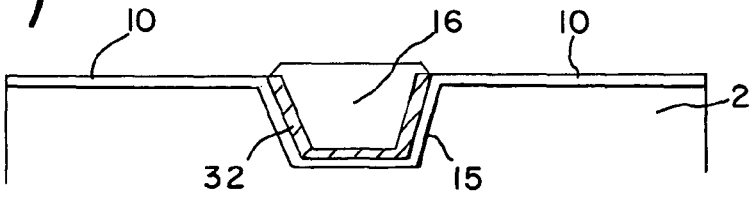

The surface of the semiconductor structure is planarized, preferably by CMP, illustrated in FIG. 4(e). In one embodiment, the etch stop layer may also comprise a polish stop layer (which may be the same as or different from the etch stop layer; e.g., under conditions known to those of ordinary skill in the art, silicon nitride may provide both etch stop and chemical-mechanical polish stop functions). In FIG. 4(f), the etch-stop layer 6 (and optionally dielectric layer 11) is removed, and a gate dielectric layer 10 may be grown on the semiconductor substrate 2. Preferably, the gate dielectric layer 10 is a gate oxide, grown thermally.

The semiconductor structure may then be used in the fabrication of semiconductor devices, with the stress buffer layer acting to reduce damage to the substrate surface at its interface with the isolation dielectric. For example, the substrate may be silicon with a thermal linear expansion of about 0.3% at 800° C., and the isolation dielectric may be silicon oxide with a thermal linear expansion of about 0.037% at 800° C. Using a stress buffer layer of silicon nitride with a thermal linear expansion of about 0.252% at 800° C., will result in only about 0.05% expansion difference at the substrate surface, as compared with about 0.26% without the stress buffer layer. The magnitude of the difference in the thermal linear expansion between the stress buffer layer and the substrate is less than that between the isolation dielectric and the substrate, and therefore inclusion of the stress buffer layer may reduce stress at the substrate surface in the isolation structure. In the case of a silicon substrate, the stress buffer layer preferably has a thermal linear expansion close to that of the silicon substrate, and more preferably, has a thermal linear expansion of 0.2% to 0.3% at 800 C.

When silicon nitride is used as the stress buffer layer, preferably it is deposited with zero stress. The stress of silicon nitride can be reduced by changing its index of refraction, for example by varying the molar gas ratio of $SiH_2Cl_2$ and $NH_3$ during its deposition. Silicon nitride with essentially zero stress can be obtained when its refractive index is about 2.35.

The individual processing steps for use in the present invention are well known to those of ordinary skill in the art, and are also described in Encyclopedia of Chemical Technology, Kirk-Othmer, Volume 14, pp. 677-709 (1995); Semiconductor Device Fundamentals, Robert F. Pierret, Addison-Wesley, 1996; and Microchip Fabrication 3rd. edition, Peter Van Zant, McGraw-Hill, 1997. Conventional chemical-mechanical polishing is described in U.S. Pat. Nos. 4,789,648, 4,954,142 and 5,262,354.

The substrate may typically be a semiconductor material conventionally known by those of ordinary skill in the art. Examples include silicon, gallium arsenide, germanium, gallium nitride, aluminum phosphide, and alloys such as $Si_{1-x}Ge_x$ and $Al_xGa_{1-x}As$, where 0×1. Many others are known, such as those listed in Semiconductor Device Fundamentals, on page 4, Table 1.1 (Robert F. Pierret, Addison-Wesley, 1996). Preferably, the semiconductor substrate is silicon, which may be doped or undoped.

Any of the dielectric layers, the etch-stop layer, and the stress buffer layer, may be made from a dielectric material conventionally known to those of ordinary skill in the art. Examples include conventional oxides, nitrides, oxynitrides, and other dielectrics, such as borophosphosilicate glass (BPSG), borosilicate glass (BSG), phosphosilicate glass, spin-on glass (SOG), silicon oxide, P-doped silicon oxide (P-glass), and silicon nitride. The dielectric layer must be made from a material that is different from the etch-stop layer.

The dielectric layer may be deposited by conventional methods known to those of ordinary skill in the art, such as by spin-on methods, sintering (which may further include sol-gel oxide formation), chemical vapor deposition, etc. A glass layer deposited by a chemical vapor deposition technique may be subject to a glass reflow step (e.g., by heating) to smooth, densify and further improve the contact between the protection layer and the substrate.

When a dielectric layer is to be etched, it is made from a material that can be etched more quickly than the etch-stop layer. If the dielectric layer is made from silicon oxide, or a glass, such as borophosphosilicate glass (BPSG), borosilicate glass (BSG), phosphosilicate glass, spin-on glass (SOG), or P-doped silicon oxide (P-glass), it may be doped in order to enhance the selectivity etching the glass or oxide instead of the etch-stop layer. Preferably, the etch selectivity (i.e., the ratio of (a) the rate of dielectric etching to (b) the rate of etch stop material etching) is at least 2:1, preferably at least 3:1, more preferably at least 5:1 and even more preferably at least 10:1. In the case of silicon oxide using silicon nitride as the etch-stop layer, an etching solution of one part HF (49%) in one part deionized water will give a selectivity of greater than 1:300.

The isolation structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

Etching of deposited films may be conducted by conventional methods known to those of ordinary skill in the art. The specific etching method and materials depend on the material being removed, the resist material and the compatibility of the etching material with the existing structure. Selection of suitable etching materials, resist materials and etching conditions is within the level of ordinary skill in the art.

Obviously, numerous modifications and variations of the present invention are possible in light of the above teachings. It is therefore to be understood that within the scope of the appended claims, the invention may be practiced otherwise than as specifically described herein.

The invention claimed is:

1. A method of making a semiconductor structure, comprising:
    forming a stress buffer layer in a trench in a substrate; followed by
    filling the trench with a dielectric to form an isolation dielectric in the substrate, wherein no plasma processing of the trench is performed after forming the trench and before filling the trench,
    the isolation dielectric is formed using high density plasma silicon dioxide, and
    the isolation dielectric is formed from a plasma prepared from a mixture comprising $SiH_4$ and $N_2O$.

2. The method of claim 1, wherein the isolation dielectric is formed using 5000 Å to 6000 Å of high density plasma silicon dioxide.

3. The method of claim 1, wherein the isolation dielectric is formed at a temperature of between 400° C. and 500° C.

4. The method of claim 1, further comprising polishing said isolation dielectric.

5. The method of claim 1, wherein said stress buffer layer is on said substrate adjacent said trench, and
said method further comprises:
polishing said isolation dielectric, followed by
removing said stress buffer layer adjacent said trench, followed by
forming a gate dielectric on said substrate adjacent said trench.

6. The method of claim 1, further comprising, prior to said forming said isolation dielectric:
etching said trench in said substrate, and
forming said stress buffer layer on said substrate.

7. A semiconductor structure formed by the method of claim 1.

8. The method of claim 1, wherein
said stress buffer layer comprises silicon nitride having a refractive index of 2.2 to 2.4, and
forming said stress buffer layer comprises LPCVD at a temperature of between 800° C. and 900° C. using a gas comprising $SiH_2Cl_2$ and $NH_3$.

9. A method of making a semiconductor structure, comprising:
forming an isolation dielectric comprising high density plasma deposition of silicon dioxide on a structure,
wherein said structure comprises,
(i) a substrate having a trench, and
(ii) a stress buffer layer in said trench, and
the isolation dielectric is formed from a plasma prepared from a mixture comprising $SiH_4$ and $N_2O$.

10. The method of claim 9, further comprising polishing said isolation dielectric.

11. The method of claim 9, wherein said stress buffer layer is on said substrate adjacent said trench, and
said method further comprises:
polishing said isolation dielectric, followed by
removing said stress buffer layer adjacent said trench, followed by
forming a gate dielectric on said substrate adjacent said trench.

12. The method of claim 11, further comprising, prior to said forming said isolation dielectric:
etching said trench in said substrate, and
forming said stress buffer layer on said substrate.

13. The method of claim 12, wherein said substrate comprises silicon.

14. The method of claim 9, further comprising, prior to said forming said isolation dielectric:
etching said trench in said substrate, and
forming said stress buffer layer on said substrate.

15. The method of claim 9, wherein said substrate comprises silicon.

16. The method of claim 15, wherein said stress buffer layer comprises silicon nitride.

17. A method of making a semiconductor device, comprising:
making a semiconductor structure by the method of claim 9; and
forming a semiconductor device from said semiconductor structure.

18. A method of making an electronic device, comprising:
making a semiconductor device by the method of claim 17; and
forming an electronic device comprising the semiconductor device.

19. The method of claim 9, wherein the isolation dielectric is formed at a temperature of between 400° C. and 500° C.

20. The method of claim 9, further comprising forming said stress buffer layer by LPCVD at a temperature of between 800° C. and 900° C. using a gas comprising $SiH_2Cl_2$ and $NH_3$, and
wherein said stress buffer layer comprises silicon nitride having a refractive index of 2.2 to 2.4.

* * * * *